United States Patent
Li et al.

(10) Patent No.: US 11,347,422 B1
(45) Date of Patent: May 31, 2022

(54) TECHNIQUES TO ENHANCE STORAGE DEVICES WITH BUILT-IN TRANSPARENT COMPRESSION FOR MITIGATING OUT-OF-SPACE ISSUES

(71) Applicant: ScaleFlux, Inc., San Jose, CA (US)

(72) Inventors: Jiangpeng Li, San Jose, CA (US); Dong Zhang, San Jose, CA (US); Yong Peng, Milpitas, CA (US); Yang Liu, Milpitas, CA (US)

(73) Assignee: SCALEFLUX, INC., San Jose, CA (US)

( * ) Notice: Subject to any disclaimer, the term of this patent is extended or adjusted under 35 U.S.C. 154(b) by 0 days.

(21) Appl. No.: 17/191,002

(22) Filed: Mar. 3, 2021

(51) Int. Cl.
*G06F 3/06* (2006.01)

(52) U.S. Cl.
CPC .......... *G06F 3/064* (2013.01); *G06F 3/0608* (2013.01); *G06F 3/0619* (2013.01); *G06F 3/0659* (2013.01); *G06F 3/0673* (2013.01)

(58) Field of Classification Search
CPC ...... G06F 3/064; G06F 3/0608; G06F 3/0619; G06F 3/0659; G06F 3/0673; G06F 12/00; G06F 13/00
See application file for complete search history.

(56) References Cited

U.S. PATENT DOCUMENTS

| | | | | |
|---|---|---|---|---|
| 6,931,410 B2* | 8/2005 | Anderson | ............... | G06F 16/13 707/999.102 |
| 2005/0256999 A1* | 11/2005 | Kishi | ................... | G06F 3/0682 711/111 |
| 2015/0121002 A1* | 4/2015 | Tsuchiyama | ........ | G06F 11/1096 711/114 |
| 2016/0103618 A1* | 4/2016 | Iliadis | ..................... | G06F 3/067 711/154 |
| 2020/0117594 A1* | 4/2020 | Zhang | ...................... | G11C 5/04 |
| 2021/0034292 A1* | 2/2021 | Vankamamidi | ......... | G06F 3/064 |

* cited by examiner

*Primary Examiner* — Tuan V Thai
(74) *Attorney, Agent, or Firm* — Hoffman Warnick LLC

(57) ABSTRACT

A storage device that provides in-storage transparent compression and implements a process for processing write requests during an out-of-space state. The process includes: receiving a write request from a host involving a set of logical block addresses (LBAs); determining if each of the LBAs in the write request is an actively used LBAs; and in response to determining that each of the LBAs in the write request are actively used LBAs, allowing the write request to be served; and in response to determining that at least one of the LBAs in the write request is not an actively used LBAs, not allowing the write request to be served and returning an error to the host.

19 Claims, 5 Drawing Sheets

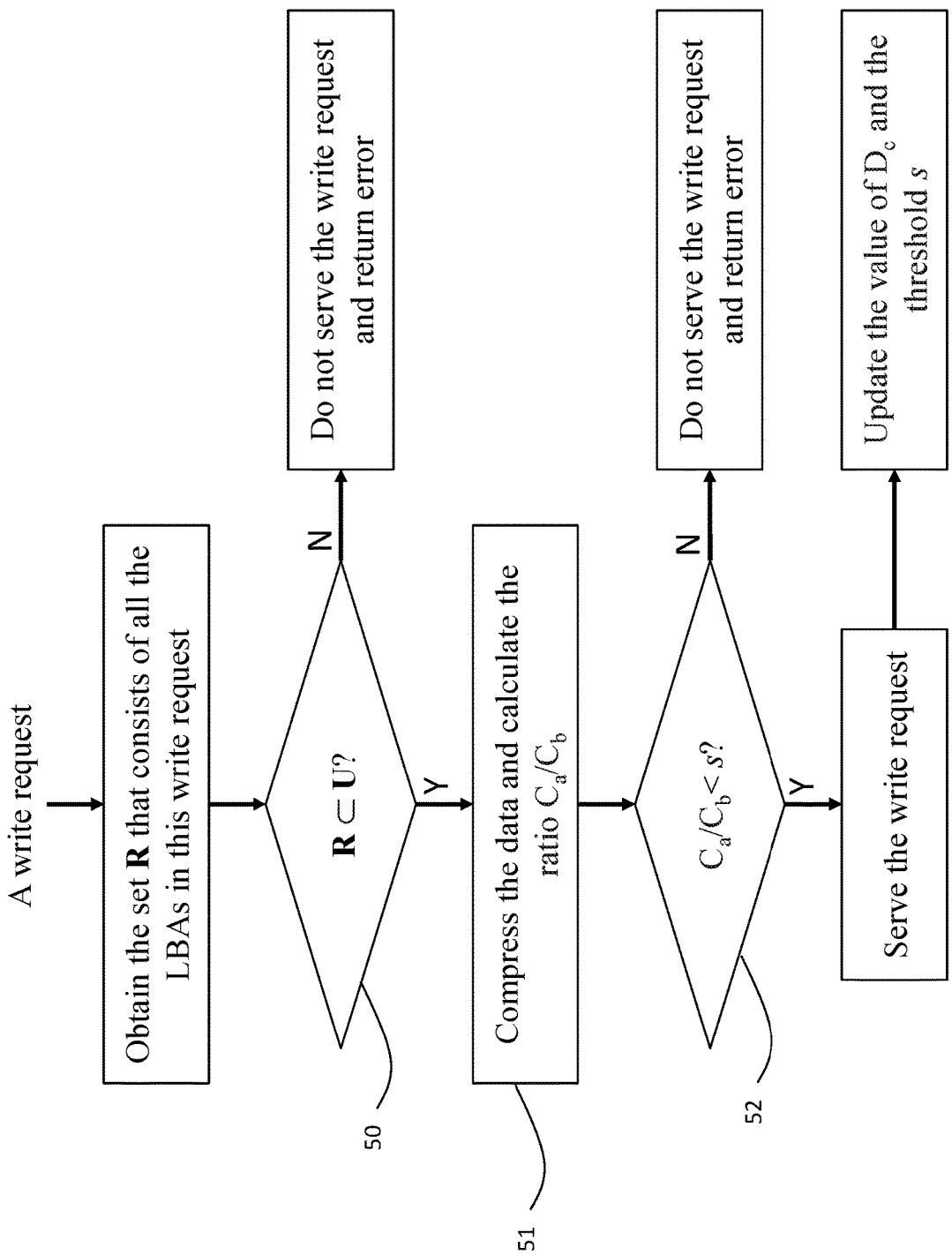
FIG. 4
(Replacement Sheet)

TECHNIQUES TO ENHANCE STORAGE DEVICES WITH BUILT-IN TRANSPARENT COMPRESSION FOR MITIGATING OUT-OF-SPACE ISSUES

TECHNICAL FIELD

The present invention relates to the field of data compression, and particularly to facilitating computing systems to utilize in-storage transparent compression.

BACKGROUND

Lossless data compression is being widely used in data storage and communication systems to reduce the cost and/or improve the speed performance. In current practice, lossless data compression is mostly implemented at either the application level (e.g., various databases) or filesystem level (e.g., ZFS and HDFS). Nevertheless, application-level and filesystem-level data compression is subject to noticeable overhead in terms of CPU usage and in-memory data movement. Compression can also be implemented inside storage devices without consuming any CPU cycles and requiring any in-memory data movement on the host side, which is referred to as in-storage transparent compression. The use of internal address mapping makes it practically feasible for solid-state storage devices to implement in-storage transparent compression. Moreover, as magnetic recording hard disk drives start to employ shingled recording technology, which demands the use internal address mapping as well, future hard disk drives could also readily support in-storage transparent compression.

To materialize the storage cost reduction, storage devices with built-in transparent compression must expose a logical block address (LBA) space that is much larger than their internal physical storage space. For example, if a storage device with built-in transparent compression internally contains total 4 TB physical flash memory, it could expose an 8 TB LBA space to the host. As long as the host data compressibility is better than 2:1, it can use this storage device to store up to 8 TB data even though the storage device internally only has 4 TB physical flash memory, leading to about 2× storage cost reduction. However, due to the runtime data compressibility variation, such storage devices could run into the out-of-space status if the overall data compressibility temporarily falls below the expected value. It is crucial for the system to promptly and safely handle the out-of-space status, for which the storage device must provide sufficient support.

SUMMARY

Accordingly, embodiments of the present disclosure are directed to methods for enhancing storage devices with built-in transparent compression to assist a system in handling write operations during an out-of-space state.

A first aspect of the disclosure is directed to a storage device, having a memory and a controller that provides in-storage transparent compression and implements a process for processing write requests during an out-of-space state of the memory that includes: receiving a write request from a host involving a set of logical block addresses (LBAs); determining if each of the LBAs in the write request is an actively used LBAs; in response to determining that each of the LBAs in the write request are actively used LBAs, allowing the write request to be served; and in response to determining that at least one of the LBAs in the write request is not an actively used LBAs, not allowing the write request to be served and returning an error to the host.

A second aspect of the disclosure is directed to a method for processing write requests during an out-of-space state in a storage controller that provides in-storage transparent compression. The method includes: receiving a write request from a host involving a set of logical block addresses (LBAs); determining if each of the LBAs in the write request is an actively used LBAs; in response to determining that each of the LBAs in the write request are actively used LBAs, allowing the write request to be served; and in response to determining that at least one of the LBAs in the write request is not an actively used LBAs, not allowing the write request to be served and returning an error to the host.

A third aspect of the disclosure is directed to a storage device, having a memory and a controller that provides in-storage transparent compression and implements a process for processing write requests during an out-of-space state of the memory. The process includes: receiving a write request from a host involving a set of logical block addresses (LBAs); determining whether a term indicative of a mount/unmount operation is contained in a thread associated with the write request; and in response to the term being contained in the thread, allowing the write request to be served.

BRIEF DESCRIPTION OF THE DRAWINGS

The numerous advantages of the present disclosure may be better understood by those skilled in the art by reference to the accompanying figures.

FIG. 4 illustrates an operational flow diagram of a further process for managing an out-of-space condition according to embodiments.

DETAILED DESCRIPTION

Reference will now be made in detail to embodiments of the disclosure, examples of which are illustrated in the accompanying drawings.

Given a storage device with built-in transparent compression, let $C_t$ denote its total physical storage capacity, and $C_u$ denote the total amount of storage space being used. Define $D_c = C_t - C_u$ (i.e., the amount of available physical storage capacity), and let $T_c$ and $T_d$ denote two fixed thresholds where $T_c \leq T_d$. The storage device enters the out-of-space state if $D_c < T_c$ (i.e., the available storage space inside the storage device drops below the threshold $T_c$). A storage device can return from the out-of-space state back to its normal operational state when $D_c$ becomes larger than $T_d$.

In the most straightforward manner, once a storage device falls into the out-of-space state, it should only serve data read and delete/discard commands. If enough data are deleted/discarded, $D_c$ will be larger than the threshold $T_d$ and hence the storage device will return to its normal state in which the storage device can serve normal data read/write/ delete commands. Such a straightforward strategy works well if the host directly uses/manages the storage device as a raw device without a filesystem. However, it does not work if the host uses/manages the storage device through the filesystem, which is explained as follows. On storage devices, in addition to user data, a filesystem must store necessary metadata (e.g., inode in Linux/UNIX filesystems) that contain enough information for the filesystem to manage all the files and storage space on the storage device. Filesystem needs to update the metadata information when performing almost all kinds of operations (e.g., read, write, delete/discard, and mount/unmount). When using the straightforward strategy, the storage device that is in the out-of-space state will report an error on any write request, which will prevent filesystem from serving write/delete/mount/unmount requests and even read operations. This will make the storage device practically unusable by the filesystem.

To address this, a storage device (having built-in transparent compression) is disclosed that includes an enhanced out-of-space management process that allows a filesystem to promptly and safely handle scenarios in which the storage device is in the out-of-space state.

Figure 1:
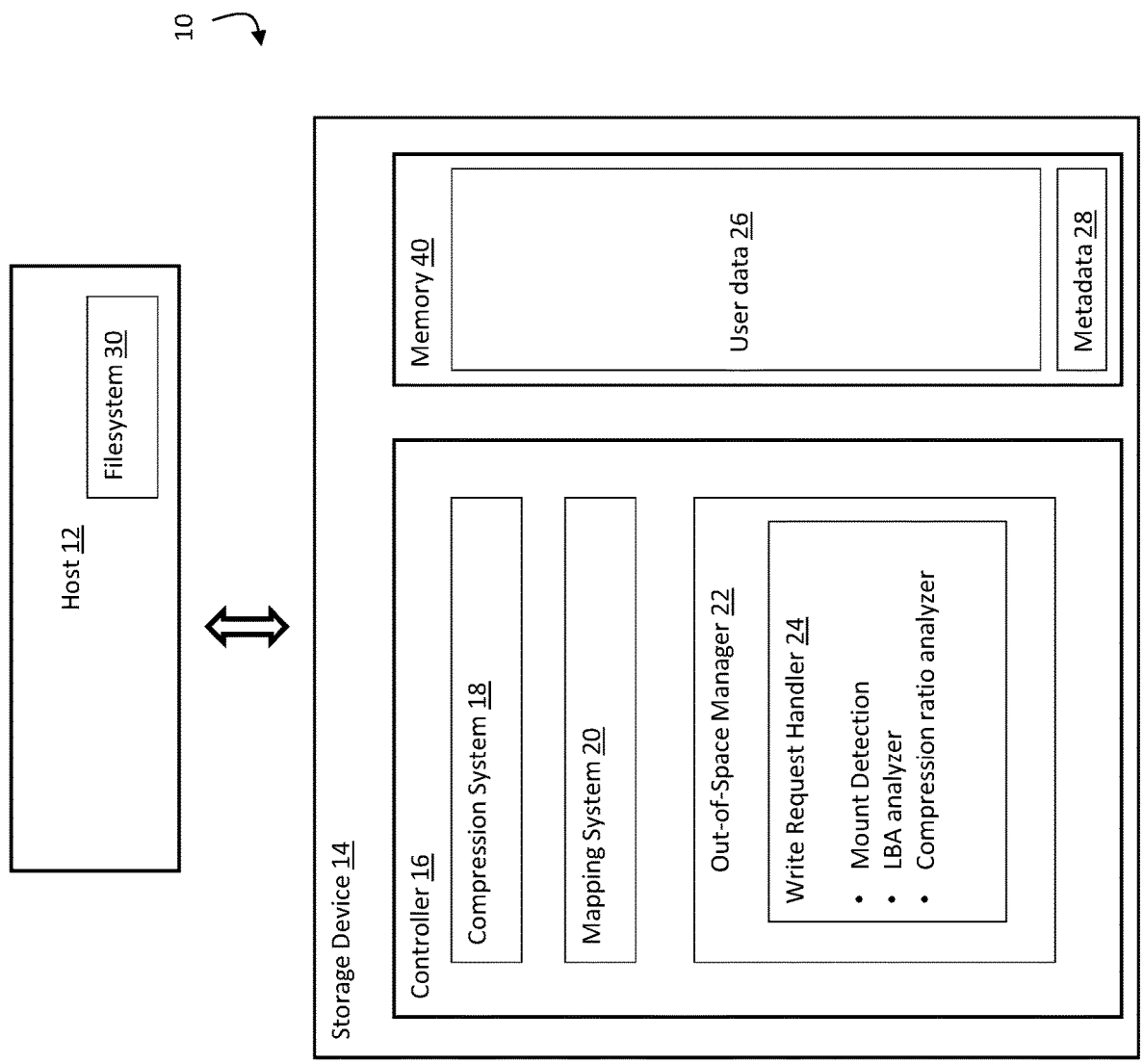
FIG. 1 illustrates the architecture of an illustrative computational storage device according to embodiments.

FIG. 1 depicts an illustrative storage infrastructure 10 that generally includes a host 12 and a storage device 14. Storage device 14 generally includes memory 40 (e.g., DRAM, NAND, flash memory, etc.) for storing user data 26 and a controller 16 for handling data storage requests (read, writes, updates, etc.) from the host 12. The controller 16 includes a compression system 18 for implementing built-in transparent compression, i.e., for compressing and decompressing user data 26 stored in memory 40. Mapping system 20 maps between logical block addresses (LBA) and physical block addresses (PBA) and keeps track of the stored user data. In addition, an out-of-space manager 22 is provided that detects when memory 40 is too full to accept any further data.

Attempts at writing further user data 26 to memory 40 when an out-of-space state occurs generally is not allowed. However, as explained, because built-in transparent compression is being utilized, the host 12 and associated filesystem 30 do not inherently know when an out-of-space state is approaching or reached. However, in order to delete data from memory 40 (e.g., as part of a garbage collection process), a small amount of filesystem metadata 28 must be updated in memory 40, which involves a write operation. Since write operations are generally not allowed in an out-of-space state, a write request handler 24 is implemented to identify write operations that are safe, i.e., likely involve a metadata 28 update. When identified as safe, the write operation is allowed to proceed.

Figure 2:
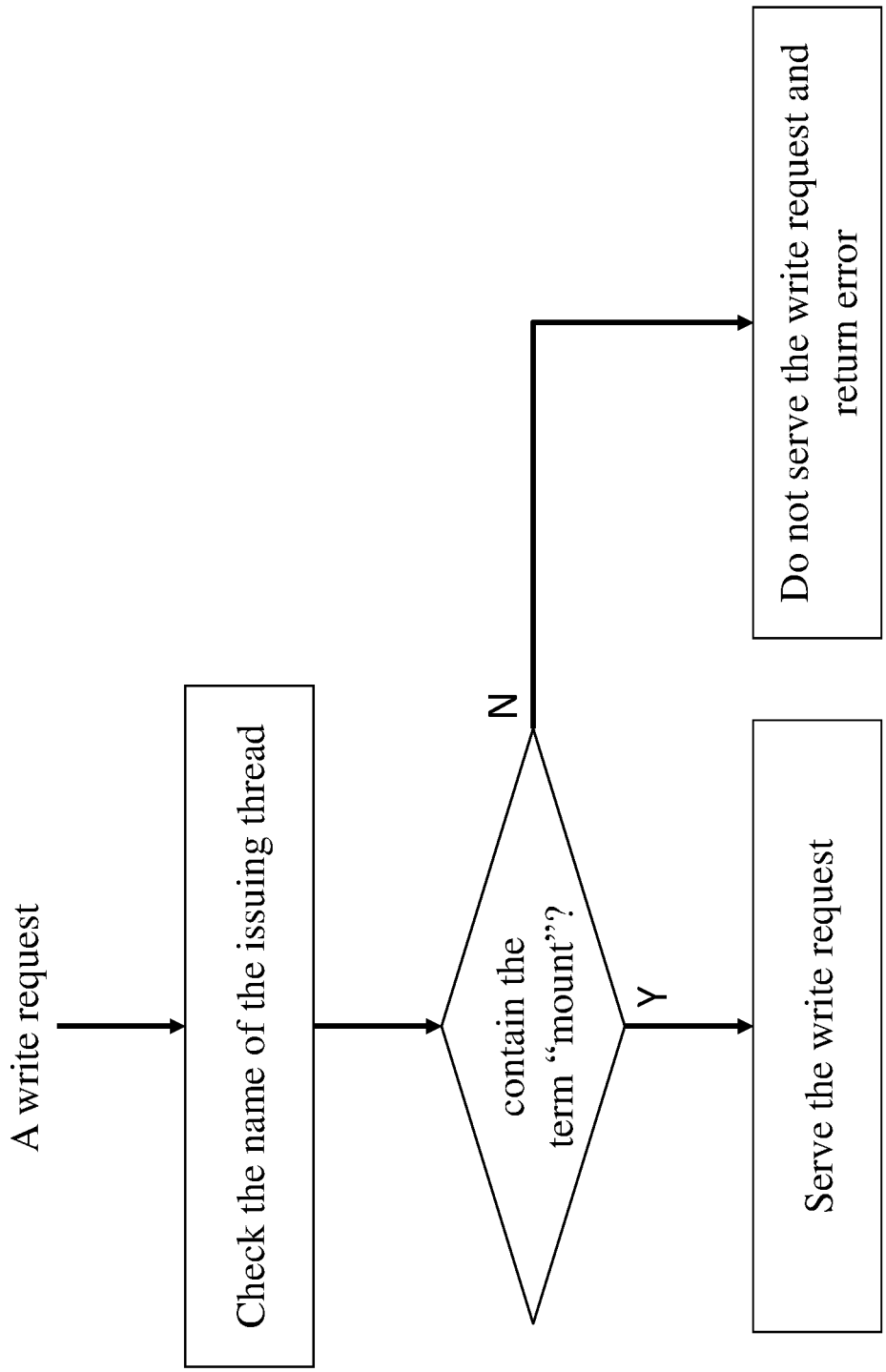
FIG. 2 illustrates an operational flow diagram of a process for processing write operation involving mount/dismount requests during an out-of-space state according to embodiments.

As illustrated in FIG. 2, a first technique involves a mount detection process that recognizes and allows system mount/unmount operations for a storage device that is in the out-of-space state. In this case, the text of the actual request being issued is analyzed to see if the thread involves a mount/unmount operation. In the example shown, the process looks for the term or character string "mount" in the thread. In a Linux-based system, when a mount/unmount operation is required for a storage device, the system uses a separate thread to carry out the mount/unmount operation, and the thread name contains the term "mount" or "unmount". Before the thread can finish the mount/unmount operation, the thread must successfully write corresponding metadata 28 to the storage device 14. Therefore, to avoid blocking system mount/unmount operations, the storage device that is in the out-of-space state will check the name of the thread that issues the write request. If the issuing thread contains the term "mount", then the storage device 14 will serve the write request. If not, the write request will not be served and an error will be returned to the host 12. It is understood that, depending on the operating system and filesystem implementation, other character strings (other than "mount") could likewise be searched for to identify similar operations that would be considered safe in an out-of-space state.

The technique of FIG. 2 is configured to enable the filesystem 30 to, e.g., successfully mount/unmount a storage device 14 that is in the out-of-space state. In order to bring the storage device 14 back to the normal state (i.e., delete user data 26), the filesystem 30 must be able to successfully write additional metadata 28 to the storage device 14. To achieve this objective, various techniques may be deployed.

Figure 3:
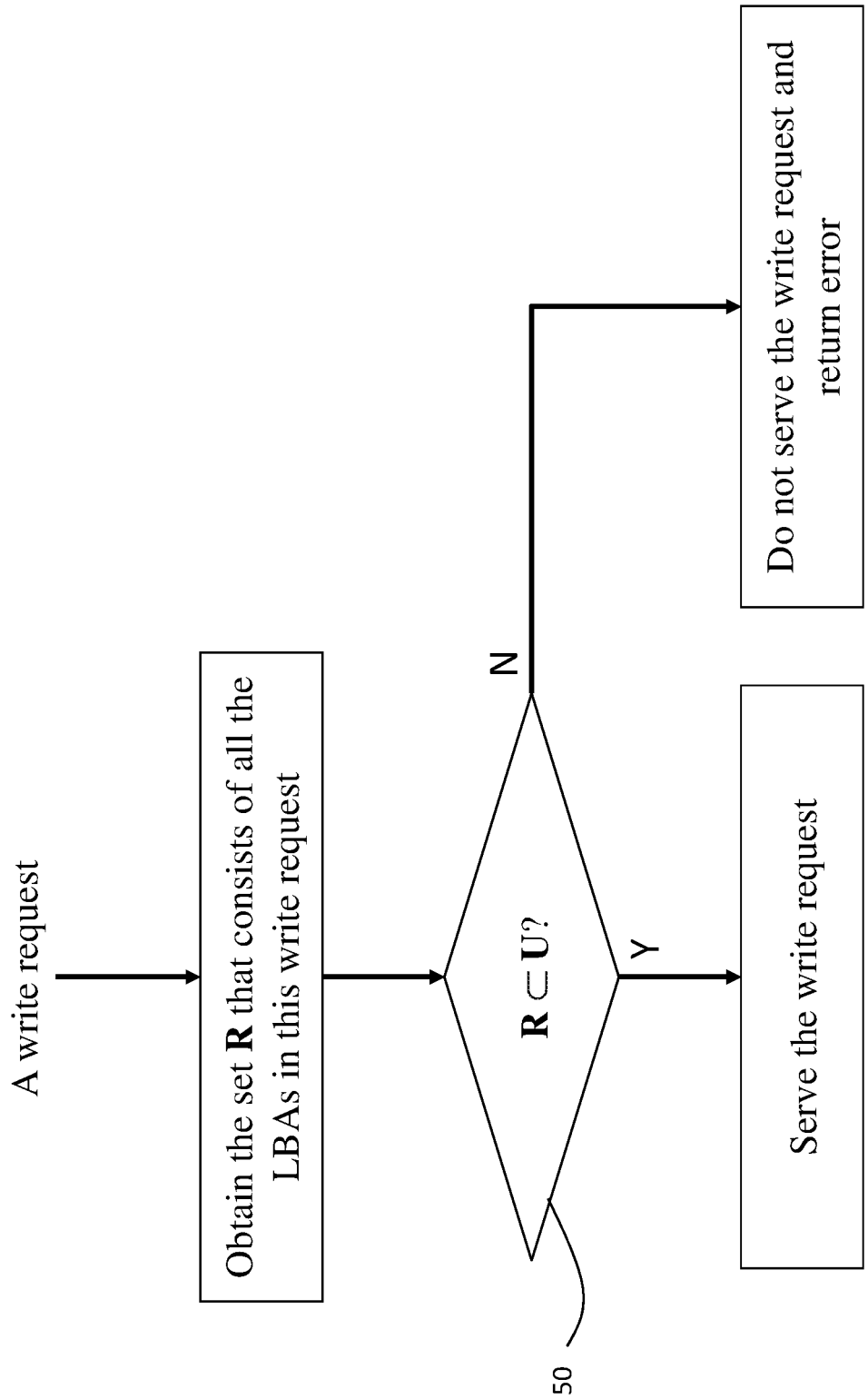
FIG. 3 illustrates an operational flow diagram of a further process for managing an out-of-space condition according to embodiments.

FIG. 3 illustrates the first technique that allows the storage device 14 allow write requests to be served in the out-of-space state. This technique is based on the observation that, once the storage device 14 has notified the filesystem 30 about being in the out-of-space state, the filesystem 30 most likely will suspend normal write/read actions and immediately carry out actions to bring the storage device 14 back to the normal state. Such actions should consist of copying and subsequently deleting/discarding data, which requires update of the filesystem metadata 28 in memory 40. When updating filesystem metadata 28, data is only written to the logical block address (LBA) that are being "actively used" by the storage device. Note that storage device 14 treats an LBA as being in active use only if the data at this LBA has not been discarded since its last write.

As shown in FIG. 3, when a write request is received in the out-of-space state, the set R of all LBAs in the request are obtained and analyzed to see if they are each in active use. Let U denote the set consisting of all the LBAs that are in active use by the storage device 14. This may for example be done with a table stored in memory 40 that tracks which LBAs are active and which are inactive. As illustrated in FIG. 3, for a storage device 14 in the out-of-space state, upon receiving a write request with the LBA range R, if $R \subset U$ (i.e., every LBA in this write request is in active use) at step 50 then the storage device 14 will serve this write request, otherwise (i.e., at least one LBA in this write request is not in active use) the storage device 14 will not serve this write request and return the out-of-space error to the host 12. Since the compressibility of filesystem metadata 28 tends to be consistently very high, updating metadata on those inactive-use LBAs will not noticeably increase $C_u$ and hence the available storage space $D_c$ after the filesystem metadata update will not noticeably reduce.

The above technique is based on the assumption that, once the storage device enters the out-of-space state, the host 12 will suspend normal operations and immediately carry out actions to bring the storage device 14 back to normal. However, if this assumption is not met, then the above technique may not be sufficient to guard against overwriting the memory 40. In particular, after being notified that the storage device 14 has entered the out-of-space state, the host 12 may simply assume that the storage device 14 can still be functional (at least over a certain period) as long as the system does not write any new data (i.e., does not write data to LBAs that are not in active use).

As a result, the system may allow the following two types of actions: (1) normal read/write operations under the condition that data are written only to LBAs that are in active use, and (2) operations (i.e., data copy/delete) that bring the storage device back to normal. In this context, due to the runtime user data compressibility, the combination of those operations may cause $D_c$ to drop and eventually make the storage device completely unusable.

Accordingly, a further enhanced technique is illustrated in FIG. 4 in which the compression ratio is also analyzed to ensure that, after the write/update to each LBA, the size of the LBA does not grow due to a lowered compression ratio. The same initial process as described in FIG. 3 is performed to ensure that the LBAs are in active use (step 50). Assuming they are, then compression ratio of the compressed data in the LBA is evaluated to step 52.

In one embodiment, given the total physical storage capacity $C_t$ and current value of $D_c$, the storage device calculates a threshold s that is proportional to the ratio $D_c/C_t$. Upon receiving a write request over the LBA range R, at step 50, if R ⊂ U (i.e., at least one LBA in this write request is not in active use), the storage device will not serve this write request and return the out-of-space error to the host, otherwise (i.e., every LBA in this write request is in active use), the storage device will evaluate the compression ratio as follows. First, let $C_b$ denote the total physical storage capacity occupied by all the LBAs in R before receiving the current write request. The storage device will first compress the data in this write request at step 51, in which $C_a$ denotes the compression output size. If $C_a/C_b<s$ at step 52, then the storage device 14 will serve this write request, otherwise the storage device 14 will not serve this write request and return the out-of-space error to the host. After each write operation, the storage device 14 also updates the value of $D_c$ and the threshold s.

Figure 5:
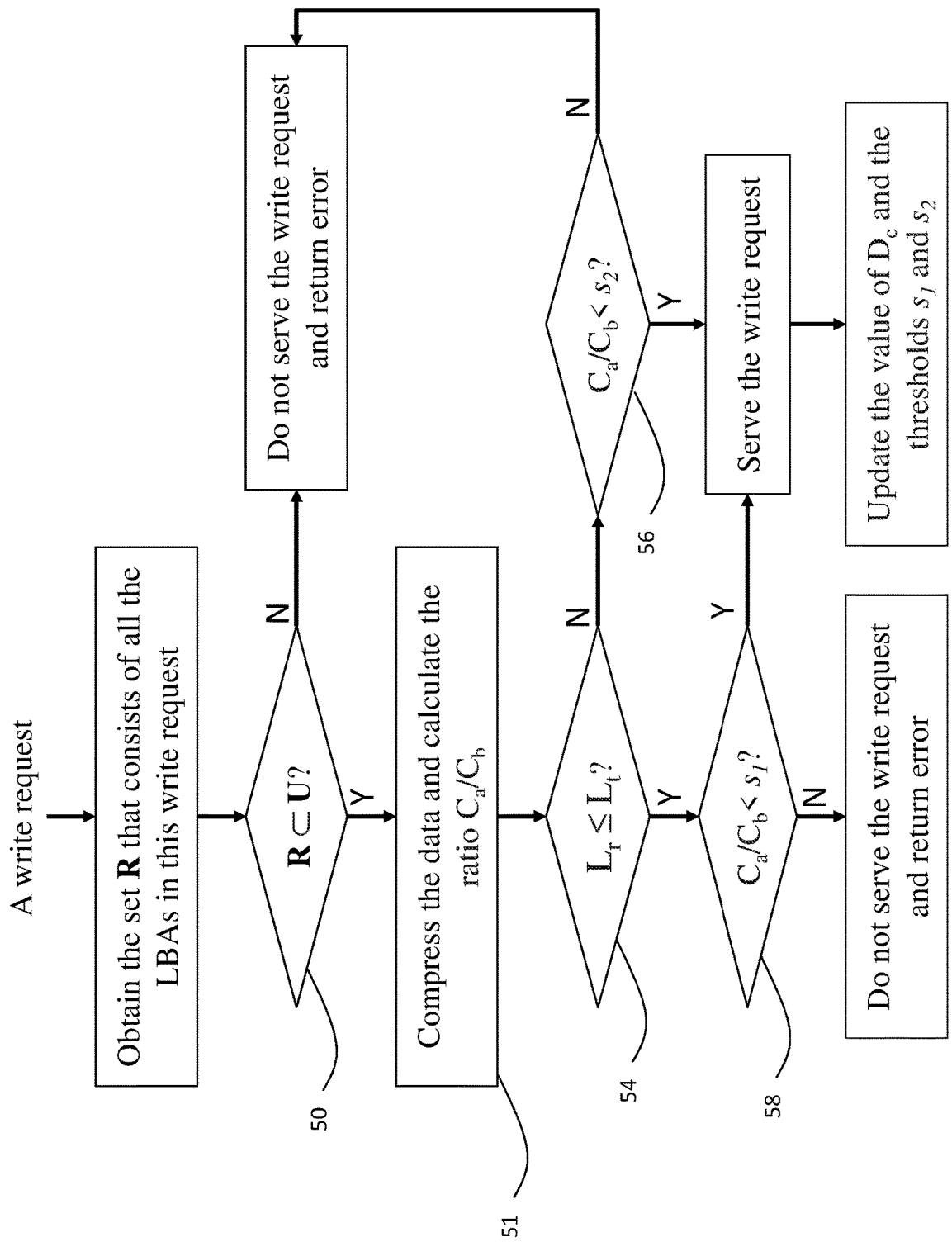
FIG. 5 illustrates an operational flow diagram of a further process for managing an out-of-space condition according to embodiments.

The process may be further altered to address additional criteria. For example, when filesystem 30 carries out actions to bring the storage device 14 back to normal, its write request tends to span over a small number of contiguous LBAs (e.g., 2 or 3). Therefore, once entering the out-of-space state, the storage device 14 may give small write request a higher priority than longer write requests. Given this, the process can be further enhanced as shown in FIG. 5. In this case, the size of write request is evaluated at step 54, and based on the result either a relaxed compression evaluation is performed at step 58 (i.e., a small write request operation) or a more strict compression evaluation is performed at step 56 (i.e., a large write operation). That is, different compression thresholds s are utilized depending on the size of the write operation.

In one approach, let $L_t$ denote a write request length threshold (e.g., 3 LBAs). Given the total physical storage capacity $C_t$ and current value of $D_c$, the storage device 14 calculates two threshold $s_1$ and $s_2$ ($s_1>s_2$) that are both proportional to the ratio $D_c/C_t$. Upon receiving a write request over the LBA range R, if R ⊂ U is no (i.e., at least one LBA in this write request is not in active use) at step 50, the storage device 14 will not serve this write request and return the out-of-space error to the host, otherwise (i.e., every LBA in this write request is in active use), the storage device 14 will proceed with the following operations. Let $C_b$ denote the total physical storage capacity occupied by all the LBAs in R before receiving the write request. The storage device 14 will first compress the data in this write request at step 51, in which $C_a$ denotes the compression output size. Let $L_r$ denote the write request length (i.e., the number of LBAs in R). If $L_r \leq L_t$ (yes at step 54) and $C_a/C_b<s_1$ (yes at 58), or $L_r>L_t$ (no at 54) and $C_a/C_b<s_2$ (yes at 56), then the storage device 14 will serve this write request, otherwise the storage device 14 will not serve this write request and return the out-of-space error to the host 12. After each write operation, the storage device 14 also updates the value of $D_c$ and the thresholds $s_1$ and $s_2$.

It is understood that aspects of the present disclosure may be implemented in any manner, e.g., as a software program, or an integrated circuit board or a controller card that includes a processing core, I/O and processing logic. Aspects may be implemented in hardware or software, or a combination thereof. For example, aspects of the processing logic may be implemented using field programmable gate arrays (FPGAs), ASIC devices, or other hardware-oriented systems.

Aspects may be implemented with a computer program product stored on a computer readable storage medium. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, etc. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Python, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

The computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. The computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by hardware and/or computer readable program instructions.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The foregoing description of various aspects of the present disclosure has been presented for purposes of illustration and description. It is not intended to be exhaustive or to limit the concepts disclosed herein to the precise form disclosed, and obviously, many modifications and variations are possible. Such modifications and variations that may be apparent to an individual in the art are included within the scope of the present disclosure as defined by the accompanying claims.

The invention claimed is:

1. A storage device, comprising:
    a memory; and
    a controller that provides in-storage transparent compression and implements a process for processing write requests during an out-of-space state of the memory that includes:
        receiving a write request from a host involving a set of logical block addresses (LBAs);
        determining if each of the LBAs in the write request is an actively used LBA;
        in response to determining that each of the LBAs in the write request is an actively used LBA, allowing the write request to be served; and
        in response to determining that at least one of the LBAs in the write request is not an actively used LBA, not allowing the write request to be served and returning an error to the host.

2. The storage device of claim 1, where an LBA is actively used if the LBA was not discarded since a previous write operation involving the LBA.

3. The storage device of claim 1, wherein the process further includes:
    prior to allowing the write request to be served:
        compressing data associated with the write request;
        comparing a compression ratio of the data with a threshold value; and
        not allowing the write request to be served if the compression ratio is above the threshold value.

4. The storage device of claim 3, wherein the threshold value is determined based on a ratio of an amount of current available storage to a total physical storage capacity.

5. The storage device of claim 1, wherein the process further includes:
    prior to allowing the write request to be served:
        in response to determining that each of the LBAs in the write request is an actively used LBA:
            compressing data associated with the write request;
            calculating a compression ratio of the data after compression;
            calculating a length of the data after compression;
            in response to the length being less than a length threshold, serving the write request only if the compression ratio is less than a first compression threshold; and
            in response to the length being greater than the length threshold, serving the write request only if the compression ratio is less than a second compression threshold, wherein the second compression threshold is less than the first compression threshold.

6. The storage device of claim 1, wherein the process further includes:
    determining whether a term indicative of a mount/unmount operation is contained in a thread associated with the write request; and
    in response to the term being contained in the thread, allowing the write request to be served.

7. The storage device of claim 6, wherein the term comprises the character string "mount".

8. A method for processing write requests during an out-of-space state in a storage controller that provides in-storage transparent compression, comprising:
    receiving a write request from a host involving a set of logical block addresses (LBAs);
    determining if each of the LBAs in the write request is an actively used LBA;
    in response to determining that each of the LBAs in the write request is an actively used LBA, allowing the write request to be served; and
    in response to determining that at least one of the LBAs in the write request is not an actively used LBA, not allowing the write request to be served and returning an error to the host.

9. The method of claim 8, where an LBA is actively used if the LBA was not discarded since a previous write operation involving the LBA.

10. The method of claim 8, further comprising:
    prior to allowing the write request to be served:
        compressing data associated with the write request;

comparing a compression ratio of the data with a threshold value; and not allowing the write request to be served if the compression ratio is above the threshold value.

11. The method of claim 10, wherein the threshold value is determined based on a ratio of an amount of current available storage to a total physical storage capacity.

12. The method of claim 8, further comprising:

prior to allowing the write request to be served:

in response to determining that each of the LBAs in the write request is an actively used LBA, compressing data associated with the write request;

calculating a compression ratio of the data after compression;

calculating a length of the data after compression;

in response to the length being less than a length threshold, serving the write request only if the compression ratio is less than a first compression threshold; and in response to the length being greater than the length threshold, serving the write request only if the compression ratio is less than a second compression threshold, wherein the second compression threshold is less than the first compression threshold.

13. The method of claim 8, further comprising:

determining whether a term indicative of a mount/unmount operation is contained in a thread associated with the write request; and in response to the term being contained in the thread, allowing the write request to be served.

14. The method of claim 13, wherein the term comprises the character string "mount".

15. A storage device, comprising:

a memory; and a controller that provides in-storage transparent compression and implements a process for processing write requests during an out-of-space state of the memory that includes:

receiving a write request from a host involving a set of logical block addresses (LBAs);

determining whether a term indicative of a mount/unmount operation is contained in a thread associated with the write request;

in response to the term being contained in the thread, allowing the write request to be served;

in response to determining that the term is not contained in the thread, determining if each of the LBAs in the write request is an actively used LBA; and in response to determining that at least one of the LBAs in the write request is not an actively used LBA, not allowing the write request to be served and returning an error to the host.

16. The storage device of claim 15, wherein the term comprises the character string "mount".

17. The storage device of claim 15, wherein the process further includes:

in response to determining that each of the LBAs in the write request is an actively used LBA:

compressing data associated with the write request;

comparing a compression ratio of the data with a threshold value;

allowing the write request to be served if the compression ratio is below the threshold value; and not allowing the write request to be served if the compression ratio is above the threshold value.

18. The storage device of claim 15, wherein the process further includes:

in response to determining that each of the LBAs in the write request is an actively used LBA:

compressing data associated with the write request;

calculating a compression ratio of the data after compression;

calculating a length of the data after compression;

in response to the length being less than a length threshold, serving the write request only if the compression ratio is less than a first compression threshold; and in response to the length being greater than the length threshold, serving the write request only if the compression ratio is less than a second compression threshold, wherein the second compression threshold is less than the first compression threshold.

19. The storage device of claim 15, wherein where an LBA is actively used if the LBA was not discarded since a previous write operation involving the LBA.

* * * * *